(12) United States Patent
Mengel et al.

(10) Patent No.: US 8,110,912 B2
(45) Date of Patent: Feb. 7, 2012

| | | |
|---|---|---|
| (54) | SEMICONDUCTOR DEVICE | |
| (75) | Inventors: | Manfred Mengel, Bad Abbach (DE); Joachim Mahler, Regensburg (DE) |
| (73) | Assignee: | Infineon Technologies AG, Neubiberg (DE) |
| (*) | Notice: | Subject to any disclaimer, the term of this patent is extended or adjusted under 35 U.S.C. 154(b) by 266 days. |
| (21) | Appl. No.: | 12/183,649 |
| (22) | Filed: | Jul. 31, 2008 |
| (65) | | Prior Publication Data |
| | US 2010/0025829 A1 | Feb. 4, 2010 |
| (51) | Int. Cl. | |
| | H01L 23/48 | (2006.01) |
| | H01L 23/495 | (2006.01) |
| (52) | U.S. Cl. ........ 257/690; 257/676; 257/693; 257/787; 257/E23.13 |
| (58) | Field of Classification Search .......... 257/724, 257/782, 784, 787, E25.016, 687, 690, 692, 257/693, E23.13, 676 |
| | See application file for complete search history. |

(56) References Cited

U.S. PATENT DOCUMENTS

| | | | |
|---|---|---|---|
| 5,637,922 A | 6/1997 | Fillion et al. | |
| 6,168,975 B1* | 1/2001 | Zhang et al. | 438/111 |
| 6,262,368 B1* | 7/2001 | Riener et al. | 174/529 |
| 6,288,904 B1* | 9/2001 | Houdeau et al. | 361/760 |
| 7,061,096 B2* | 6/2006 | Fjelstad et al. | 257/692 |
| 7,088,004 B2 | 8/2006 | Standing | |
| 7,208,347 B2 | 4/2007 | Seliger et al. | |
| 7,371,610 B1* | 5/2008 | Fan et al. | 438/112 |
| 2007/0085225 A1* | 4/2007 | Mengel | 257/792 |
| 2008/0217765 A1* | 9/2008 | Yoder et al. | 257/723 |

FOREIGN PATENT DOCUMENTS

| | | |
|---|---|---|
| WO | 0175961 | 10/2001 |
| WO | 2004077548 | 9/2004 |

* cited by examiner

*Primary Examiner* — Tuan N. Quach
(74) *Attorney, Agent, or Firm* — Dicke, Billig & Czaja, PLLC

(57) ABSTRACT

A method of manufacturing a semiconductor device includes providing a foil formed of an insulating material, where the foil includes at least one electrically conducting element, providing a chip having contact elements on a first face of the chip, and applying the foil over the contact elements of the chip.

8 Claims, 8 Drawing Sheets

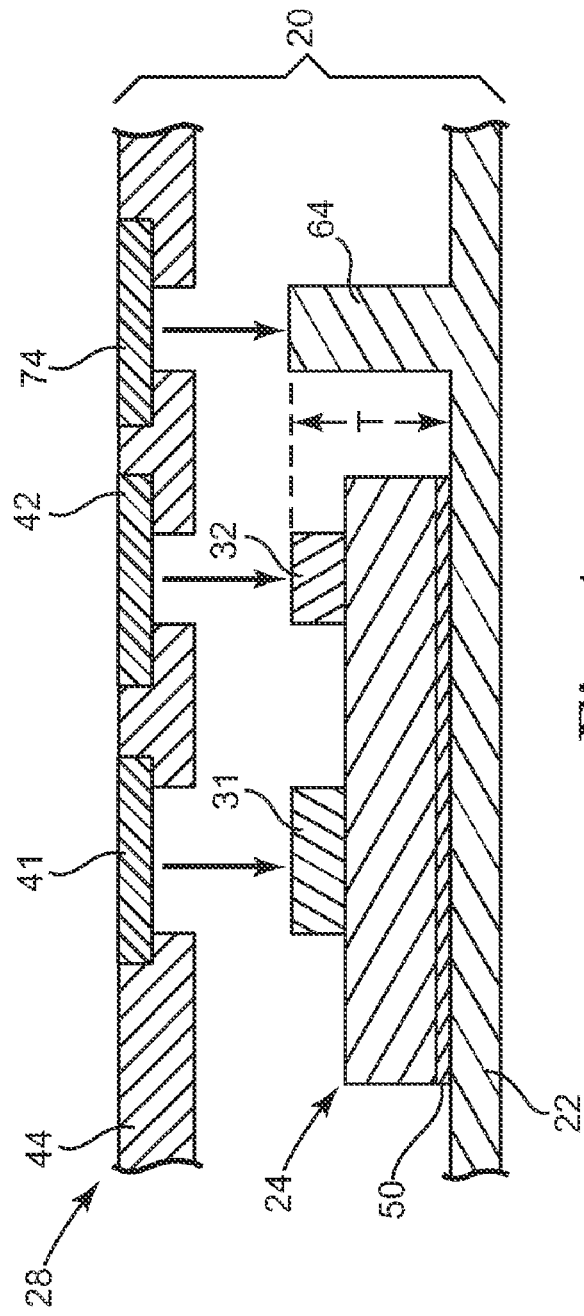
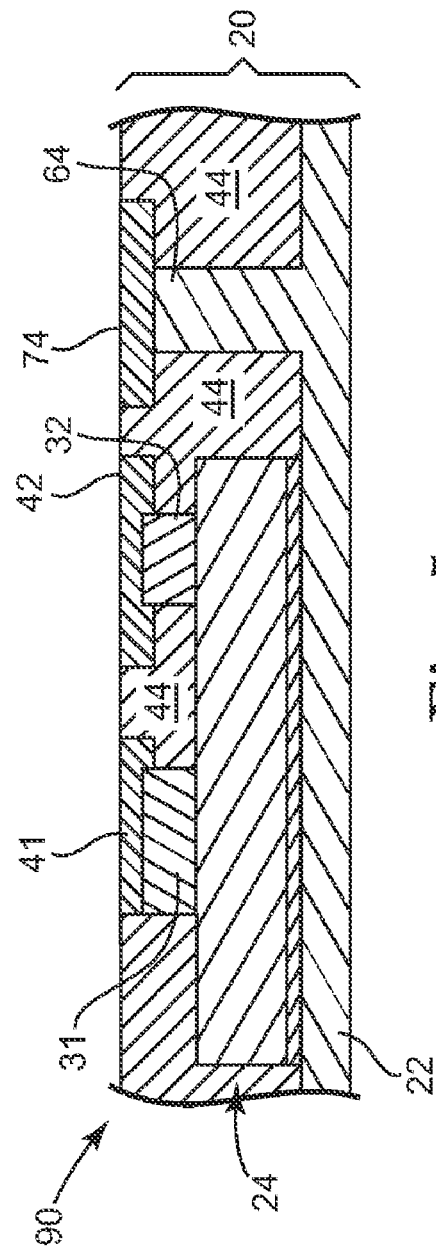

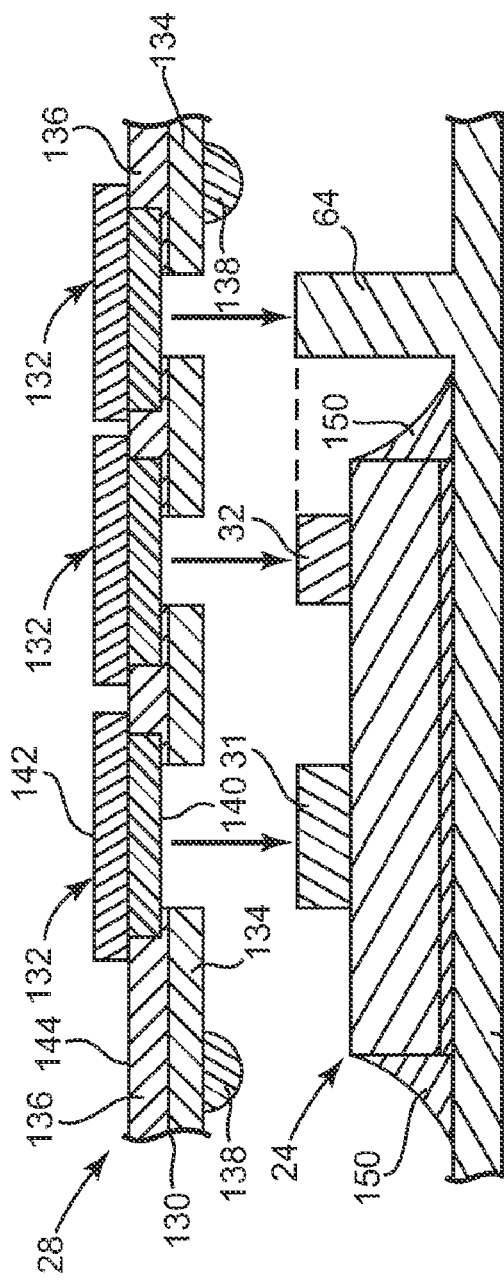
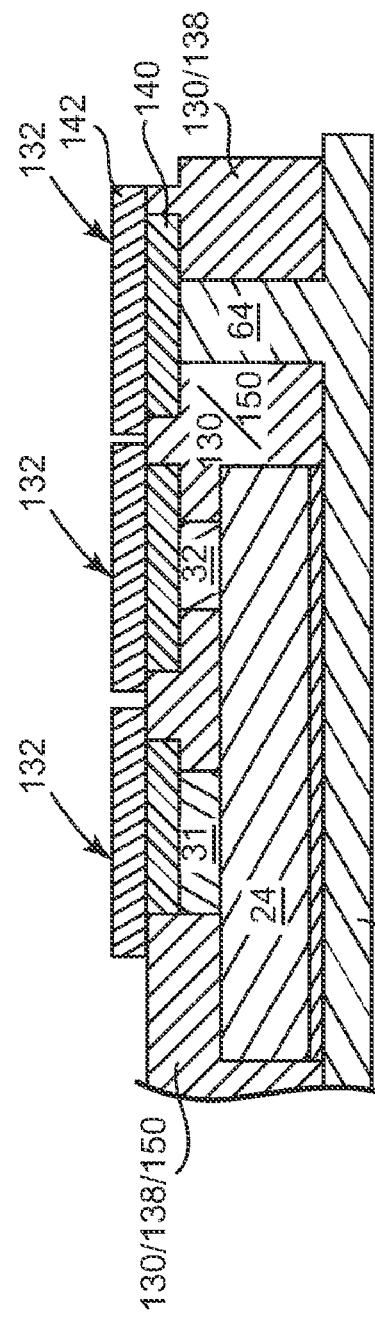
Fig. 8A
Fig. 8B

SEMICONDUCTOR DEVICE

BACKGROUND

Market demand for smaller and more functional electronic devices has driven the development of semiconductor devices, including semiconductor power packages and entire systems disposed on a chip. Some electronic devices, such as cellular telephones, employ a variety of design-specific electronic components. Other electronic devices, such as power packages utilized in the automotive industry, employ one or more logic chips connected to a leadframe and one or more power transistors connected to the leadframe and the logic chip(s). The space available inside the electronic devices is limited, particularly as the electronic devices are made smaller.

Wire bonds are employed in some known semiconductor packages to electrically connect the chip(s) to the carrier. The wire bonds are time consuming to connect, but when attached, provide a first level interconnect to the chip. When the chips in power packages are wirebonded, the wires are typically provided with diameters of between 100-500 micrometers to enable sufficient current flow to/from the chips. However, wires having a diameter of between 100-500 micrometers are relatively large and limit miniaturization of the packages. In addition, these conventional interposer-based semiconductor packages have a relatively low input/output density.

Photolithographic-fabricated conducting lines are employed with other known semiconductor packages to electrically connect chips to chips, and/or chips to the carrier. The conducting lines are formed with photolithographic masking, deposition of metal relative to the masking, and removal of the masking to reveal metal lines. Photolithographic formation of conducting lines can be expensive due to the exacting application of masks and the exacting tolerances of the deposition of the electrical conducting material.

Both the manufacturers and consumers of electronic devices desire devices that are reduced in size and yet have increased device functionality.

For these and other reasons there is a need for the present invention.

SUMMARY

One aspect provides a method of manufacturing a semiconductor device. The method includes providing a foil formed of an insulating material, where the foil includes at least one electrically conducting element, providing a chip having contact elements on a first face of the chip, and applying the foil over the contact elements of the chip.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 4 is a cross-sectional view of one embodiment of the foil assembly oriented over the chip prior to coupling the foil assembly to the chip to form a semiconductor device.

FIG. 5 is a cross-sectional view of the foil assembly illustrated in FIG. 1 attached to one of the chips illustrated in FIG. 1.

FIG. 8A and FIG. 8B are cross-sectional views of another foil assembly configured to be coupled to another carrier according to one embodiment.

DETAILED DESCRIPTION

Figure 1:
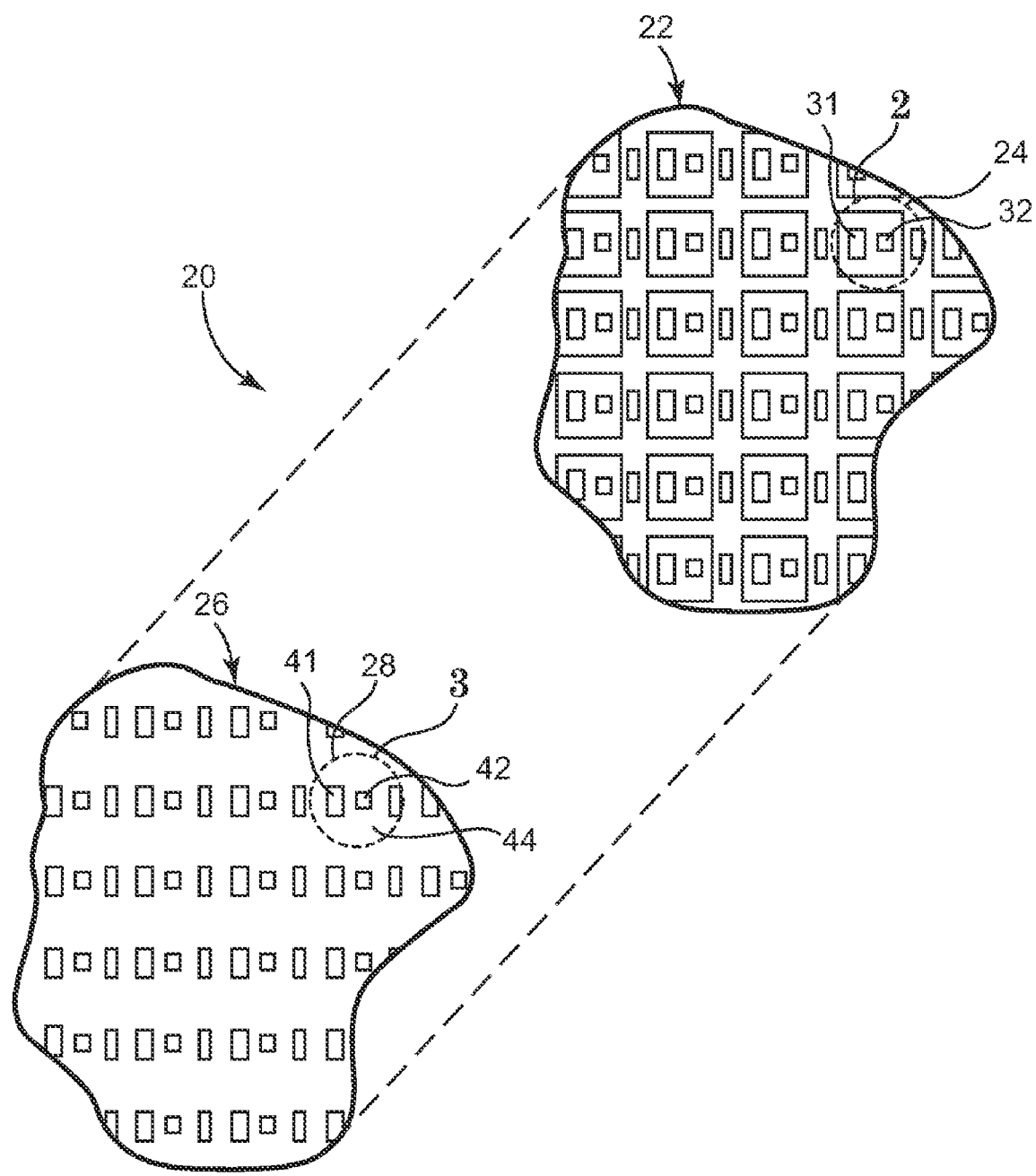
FIG. 1 is an exploded top view of an assembly of integrated power packages including an encapsulation unit configured to be attached over a carrier supporting a plurality of chips according to one embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Embodiments provide a monolithic encapsulation unit that is configured to be capped over a carrier or leadframe supporting a plurality of chips to form concurrent electrical connection to contacts on the chips and to the carrier/leadframe. The monolithic encapsulation unit is formed to provide upper metal contacts that connect to contacts formed on each chip and a dielectric that is configured to encapsulate around the contacts on the chip.

In this specification, "monolith" and "monolithic" mean a one-piece, single unit assembly. A monolithic encapsulation unit is a one-piece assembly that includes at least one conducting element disposed in a sea of dielectric material.

In this specification, "concurrent" means that the action occurs at substantially the same time. Concurrent electrical connection to contacts on the chips and to the carrier/leadframe means that the one-piece assembly of the encapsulation unit forms electrical connection to the contacts on the chips at substantially the same time that electrical connection is made to the carrier/leadframe.

Embodiments of the encapsulation unit enable a variety of footprint designs or electrical contact structures that are selectively sized to mate over a variety of chip/leadframe designs. Embodiments provide an encapsulation unit that is compatible with existing leadframe and chip configurations. Embodiments provide a flexible footprint encapsulation unit that is compatible with future different power package configurations by selectively configuring the location of the contacts in the encapsulation unit. The encapsulation units are fabricated to accommodate different power package designs.

Embodiments provide an encapsulation unit having metallization layers that contact across an entirety of the area of a metal bump or contact formed on the chip. The encapsulation unit provides improved electrical connection to contacts formed on the chip.

FIG. 1 is an exploded top view of an assembly 20 of integrated power packages according to one embodiment. Assembly 20 includes a carrier 22 or a leadframe 22 supporting a plurality of chips 24, and a monolithic encapsulation unit 26 having a plurality of foil assemblies 28 that are sized and configured to attach over each chip 24 to provide electrical connection to the chip and electrical isolation between contacts formed on the chip. In one embodiment, assembly 20 includes one or more integrated power semiconductor packages.

In one embodiment, a method of manufacturing assembly 20 includes providing foil assembly 28 that has one or more electrically conducting element 41 or 42 surrounded by dielectric material 44, providing chip 24 having contact elements 31, 32 on a first face of chip 24, and applying foil assembly 28 over the contact elements 31, 32 of chip 24. Foil assembly 28 is applied or capped over carrier 22 and chip 24 to connect conducting elements 41, 42 to contact elements 31, 32, which forms a concurrent electrical connection for assembly 20. Electrical connection to contacts 31, 32 of chip 24 is more efficient with this direct one-step approach as compared to incremental wire bonding to the contacts, and the conducting elements 41, 42 are sized to provided improved connection to contacts 31, 32 (i.e., larger contact area that provides lower connection resistance).

In one embodiment, each chip 24 includes a first contact 31 and a second contact 32, where each of the contacts 31, 32 is disposed on a pad of the chip 24 to provide an electrical pathway into the chip 24. In one embodiment, foil assembly 28 includes a first conducting element 41 and a second conducting element 42, where the conducting elements 41, 42 are discretely distributed in a dielectric film 44. When encapsulation unit 26 is attached over leadframe 22, first conducting unit 41 connects with first contact 31, second conducting element 42 connects with second contact 32, and the insulating dielectric film 44 fills between and electrically isolates first contact 31 from second contact 32.

Figure 2:
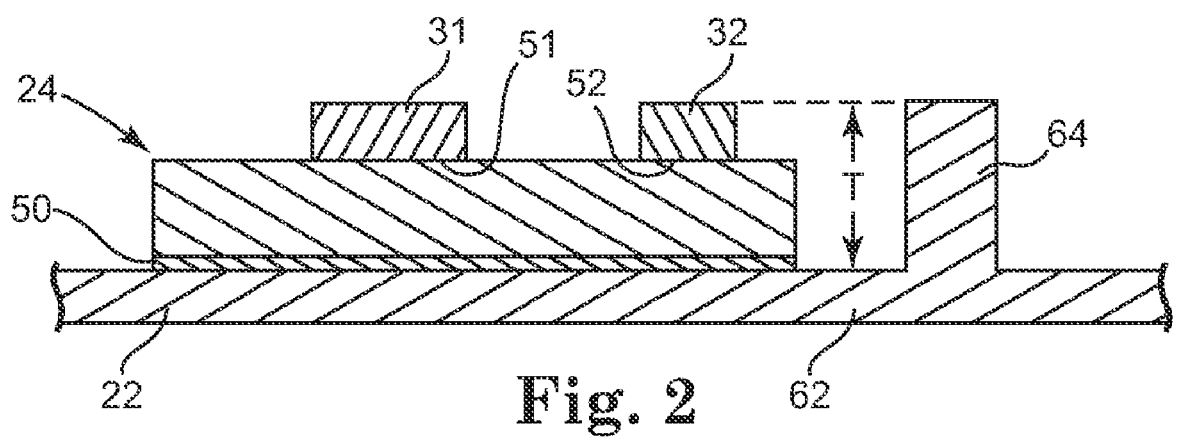
FIG. 2 is a cross-sectional view of one chip on the carrier illustrated in FIG. 1.

FIG. 2 is a cross-sectional view of chip 24 attached at an interface 50 to leadframe 22. Chip 24 includes semiconductor chips in general and can include any chip suitable for use in a semiconductor package, such as logic chips, power chips, metal oxide semiconductor field effect transistor chips and the like.

In one embodiment, interface 50 forms an electrical connection between chip 24 and leadframe 22 and includes diffusion brazed material, solder, electrical connection paste, lead blobs, or electrical guidance sticking. In one embodiment, interface 50 is an electrically conductive adhesive that connects chip 24 to carrier 22. In one embodiment, interface 50 is a double-sided electrically conductive adhesive tape, although other suitable adhesives and forms of adhesives are also acceptable.

In one embodiment, first contact 31 is a metal contact that is connected to a first pad 51 on chip 24, and second contact 32 is a metal bump electrically connected to a second pad 52 of chip 24. In one embodiment, first pad 51 is provided as a source pad and second pad 52 is provided as a gate pad, where the pads 51, 52 are provided at the wafer level. Contacts 31, 32 are fabricated to electrically connect with their respective pads 51, 52 on the wafer level. In one embodiment, contacts 31, 32 are formed of an electrically conductive metal such as gold, nickel, or other suitable conductor and are fabricated at the wafer level and disposed on respective pads 51, 52.

Carrier 22 provides a support structure for the assembly 20 of integrated power packages and includes substrates or leadframes. Substrates include laminated substrates, flex substrates, ceramic substrates, or silicon substrates. Leadframes include frames formed of metal such as copper, aluminum, alloys of copper, alloys of aluminum, or other suitable electrically conducting metals. In one embodiment, leadframe 22 includes a quad flat package (QFP) leadframe having leads on four sides. In one embodiment, leadframe 22 includes a dual flat no-lead (DFN) leadframe having leads on two opposing sides. In one embodiment, leadframe 22 includes a non-leaded very-thin quad flat no-lead (VQFN) leadframe.

In one embodiment, leadframe 22 includes a base 62 and a pillar 64 extending from base 62. In one embodiment, pillar 64 extends a distance T from base 62 and forms a drain that is in electrical contact with base 62. Drain 64 or pillar 64 is a protruding element of leadframe 22. In one embodiment, interface 50, chip 24, and contacts 31, 32 combine to extend the distance T above leadframe 22 such that contacts 31, 32 are in the plane of pillar 64. In one example, the thickness of interface 50 is approximately 5-50 micrometers, the thickness of chip 24 is approximately 40-60 micrometers, and the thickness of contacts 31, 32 is approximately 15-40 micrometers such that the distance T is between approximately 80-150 micrometers.

Figure 3:
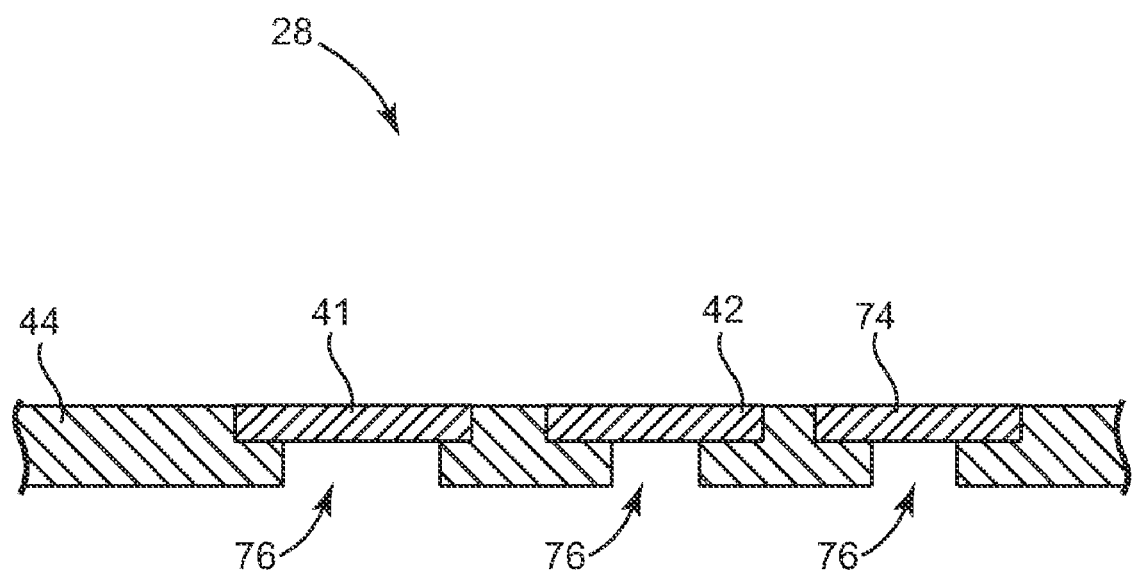
FIG. 3 is a cross-sectional view of a foil assembly of the encapsulation unit illustrated in FIG. 1.

FIG. 3 is a cross-sectional view of monolithic foil assembly 28. In one embodiment, a plurality of conducting elements 41, 42, 74 are formed to provide a communication path through film 44. Foil assembly 28 is configured to be provided in a variety of forms to provide a desired number, shape, and conformation of conducting elements that are discretely disposed in film 44. That is to say, each foil assembly 28 can include more than three conducting elements or fewer than three conducting elements. In general, film 44 is fabricated to provide a hole 76 that provides a pathway through the film to the conducting elements 41, 42, 74. Suitable methodologies for fabricating foil assembly 28 are described below in FIGS. 6-7.

FIG. 4 is a cross-sectional view of one foil assembly 28 of monolithic encapsulation unit 26 aligned over chip 24 and leadframe 22. In one embodiment, each foil assembly 28 of encapsulation unit 26 is sized and configured to mate over each chip 24 such that conducting element 41 aligns with first contact 31, conducting element 42 aligns with second contact 32, and conducting element 74 aligns with drain 64 to achieve concurrent contact between the conducting elements of foil assembly 28 and chip 24 upon assembly. In this manner, when encapsulation unit 26 is capped over each chip 24, concurrent electrical connection is established between the conducting elements of the foil and the contacts of the chip.

FIG. 5 is a cross-sectional view of one semiconductor device 90 of assembly 20 according to one embodiment. Conducting elements 41, 42, 74 are in electrical connection with contacts 31, 32, 64 and film 44 has flowed to encapsulate between contacts 31, 32, 74. In one embodiment, conducting elements 41, 42, 74 connect across an entirety of the surface area of contacts 31, 32, 64, respectively, to provide improved electrical connection to the chip. As noted above, in one embodiment contact 31 provides a source communicating with chip 24, contact 32 provides a gate communicating with chip 24, and drain 64 provides a vertical electrical pathway between upper level contact 74 and leadframe 22.

In one embodiment, monolithic encapsulation unit 26 (FIG. 1) is attached to leadframe 22 with heat and pressure. For example, in one embodiment encapsulation unit 26 is molded over chip 24 and carrier 22 a temperature range of 200-400 degrees Celsius such that film 44 flows around contacts 31, 32, 64 to encapsulate and electrically insulate the contacts. The pressure and temperature of the formation process creates an electrical contact between conducting elements 41, 42, 74 and their respective contacts 31, 32, 64. In one embodiment, encapsulation unit 26 (FIG. 1) is attached to leadframe 22 with an adhesive.

In one embodiment, a diffusion enhancer such as a conductive paste is provided on a surface of contacts 31, 32, 64 to improve connection between conducting elements and the contacts during the attachment process. In particular, contacts 31, 32 are generally formed of a brittle electrically conducting material, and it has been discovered that providing an electrical conducting paste between contact 31, 32 and conducting elements 41, 42 enhances adhesion between encapsulation unit 26 and chip 24. Suitable conduction enhancers include about 10 micrometers of a diffusion solder of gold/tin, solder balls, soft electrically conducting metals, or solder paste.

FIGS. 6A-6D are cross-sectional views of the fabrication of foil assembly 28 according to one embodiment.

Figure 6A:
FIG. 6A-6D are a cross-sectional views of the fabrication of a foil assembly according to one embodiment.

FIG. 6A is a cross-sectional view of a polymer film 44. Suitable polymers include thermoplastic polymers, thermosets, blends of thermoplastics, layers of plastics, or curable polymers.

Figure 6B:
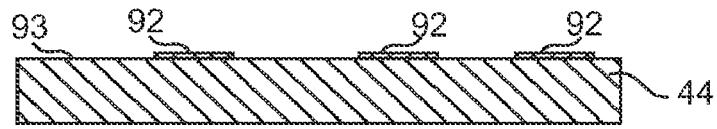

FIG. 6B is a cross-sectional view of film 44 including seed layers 92 selectively printed across a surface 93 of film 44. In one embodiment, seed layers 92 are lithographically structured onto film 44 to prepare film 44 to receive subsequent metal layers.

Figure 6C:

FIG. 6C is a cross-sectional view of film 44 including metal layers 41, 42, 74 plated onto the seed layers 92 (FIG. 6B). In one embodiment, the metal layers are electroless plated onto the seed layers 92 to form relatively thick metallized conducting elements 41, 42, 74.

Figure 6D:
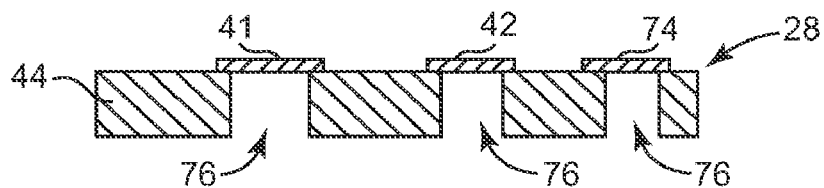

FIG. 6D is a cross-sectional view of film 44 including conducting elements 41, 42, 74 and holes 76 formed in film 44 to open a pathway to the conducting elements. In one embodiment, the holes are formed by laser drilling into film 44. In another embodiment, the holes are formed by punching or otherwise removing the polymer film under each conducting element 41, 42, 74.

Figure 7A:
FIGS. 7A-7C are cross-sectional views of another fabrication of a foil assembly according to one embodiment.
Figure 7B:
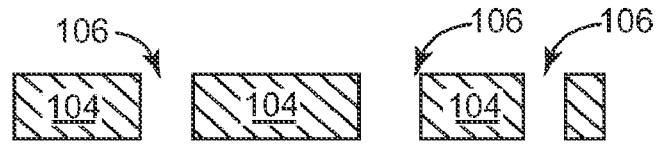
Figure 7C:
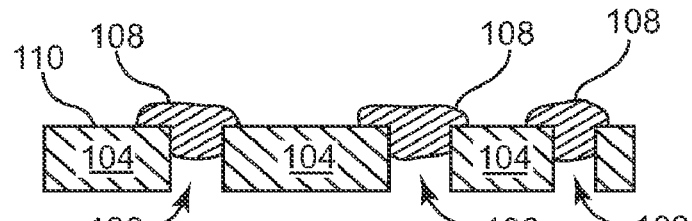

FIGS. 7A-7C are cross-sectional views of the fabrication of a foil assembly 28 according to another embodiment.

FIG. 7A is a cross-sectional view of a polymer film 104. Polymer film 104 is similar to film 44 described above.

FIG. 7B is a cross-sectional view of a holes 106 formed in polymer film 104. Suitably processes for forming holes 106 include laser drilling, punching, ablation, or photolithographic processing.

FIG. 7C is a cross-sectional view of polymer film 104 provided with holes 106 and metal conducting elements 108 disposed at least partially into each hole 106. In one embodiment, conducting elements 108 are solder balls that are selectively disposed into each hole 106 such that a portion of the solder ball is exposed on a first surface 110 of polymer film 104.

Embodiments provide a flexible footprint encapsulation unit that is compatible with multiple different power package configurations, for example by selectively configuring the location of the contacts in the encapsulation unit as shown in the exemplary embodiments below. The encapsulation unit includes dielectric material that is configured to melt and flow around contacts on the chip to encapsulate the contacts and at least partially fill recesses formed by the topography of the chip, as described below.

FIGS. 8A and 8B are cross-sectional views of a foil assembly 128 configured for attachment to chip 24 and leadframe 22 according to another embodiment. Embodiments provide for a sufficient level of dielectric material to fully encapsulate around contacts 31, 32 including recesses formed around chip 24. In one embodiment, foil assembly 128 includes a polymeric dielectric film 130 surrounding a plurality of conducting elements 132. In one embodiment, polymeric dielectric film 130 includes a first layer 134 coupled to a second layer 136, where first layer 134 is a polymer having a melting point that is lower than a melting point of the polymer that forms second layer 136. One suitable polymer for layer 134 includes polyetheretherketone (PEEK) and one suitable polymer for layer 136 includes polytetrafluoroehtylene (PTFE), although other polymers are acceptable. In one embodiment, at least a portion of first layer 134 includes a bead 138 of additional low melting point polymer that is configured to contribute to fully encapsulating around chip 24.

In one embodiment, conducting elements 132 include a first conductor 140 discretely disposed within film 130 and a second conductor 142 coupled to first conductor 140 and distributed across at least a portion of a top surface 144 of film 130. This embodiment illustrates that conducting elements 132 may be fabricated in a variety of configurations suited to the design goals of specific power packages.

In one embodiment, chip 24 is electrically coupled to leadframe 22 and includes a fillet 150 of material disposed around side surfaces of chip 24 and in contact with leadframe 22. Fillet 150 is configured to cooperate with bead 138 to provide full encapsulation around chip 24 and contacts 31, 32.

Figure 9A:
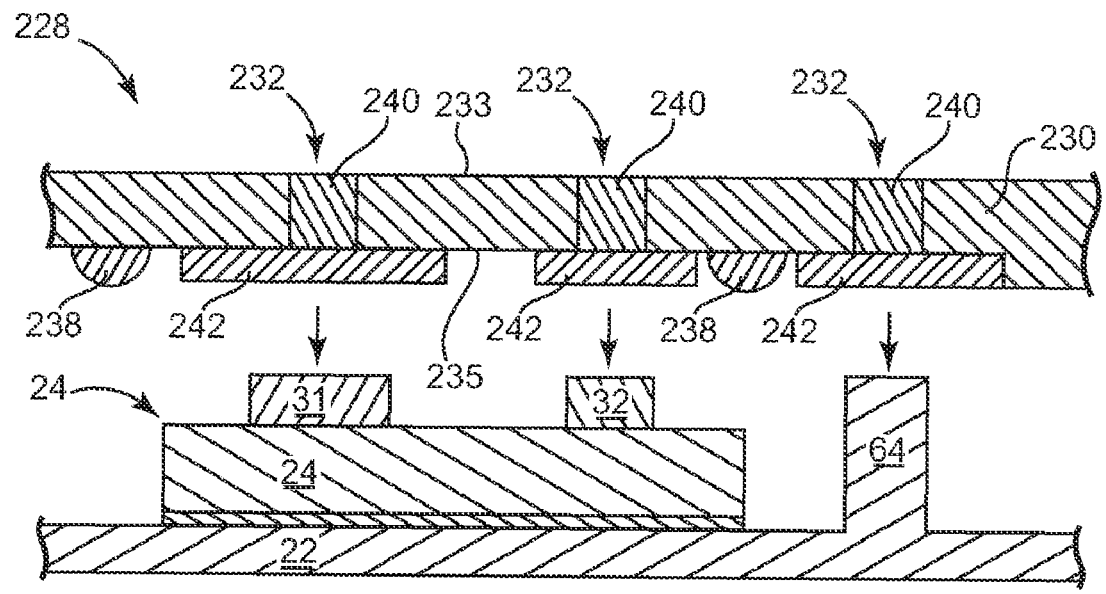
FIG. 9A and FIG. 9B are cross-sectional views of another foil assembly configured to be coupled to another carrier according to one embodiment.
Figure 9B:
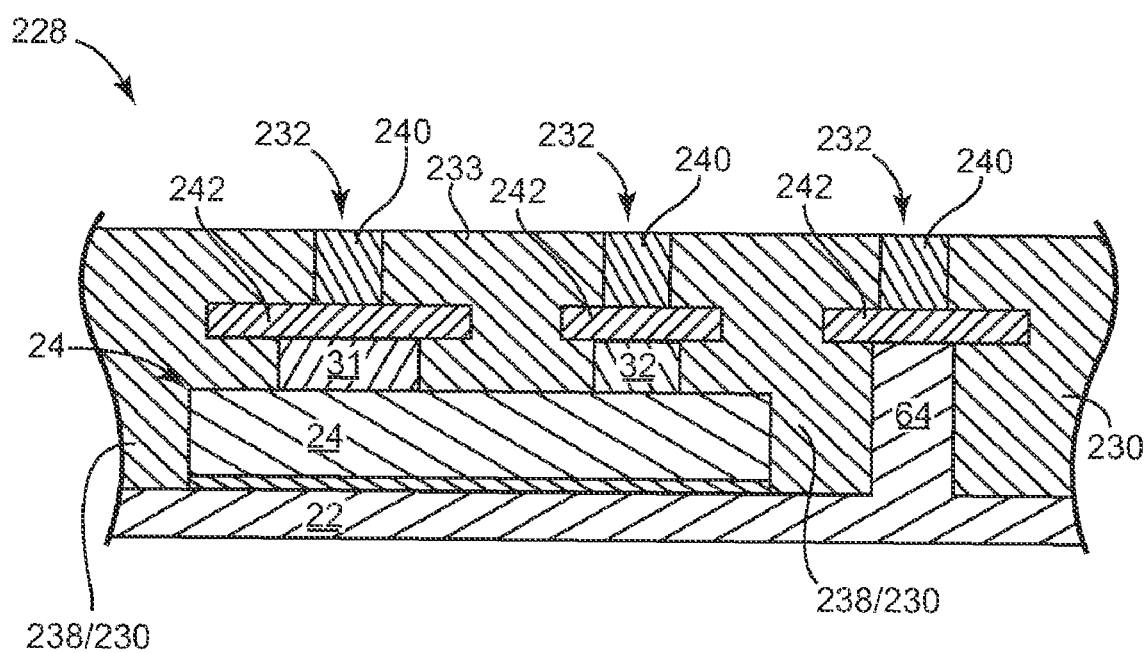

FIGS. 9A and 9B are cross-sectional views of another embodiment of a foil assembly 228 configured to be coupled to chip 24 and leadframe 22. In one embodiment, foil assembly 228 includes a polymer film 230 and a plurality of conducting elements 232 distributed through polymer film 230. In one embodiment, polymer film 230 defines a first surface 233 opposite a second surface 235 and includes one or more beads 238 of polymer material attached to second surface 235. In one embodiment, conducting elements 232 include a first conducting element 240 extending between surfaces 233, 235 and a second conducting element 242 coupled to first conducting element 240 and extending over a portion of second surface 235 of polymer film 230. In one embodiment, second conducting elements 242 have a surface area that is greater than a surface area of any one of the contacts 31, 32, 64.

Foil assembly 228 is attached to chip 24 and leadframe 22 by a high pressure and temperature process such that conducting element 242 connect to a respective one of contacts 31, 32, 64 and polymer film 230 and beads 238 combine to fully encapsulate sides of chip 24 and around contacts 31, 32, 64.

Figure 10A:
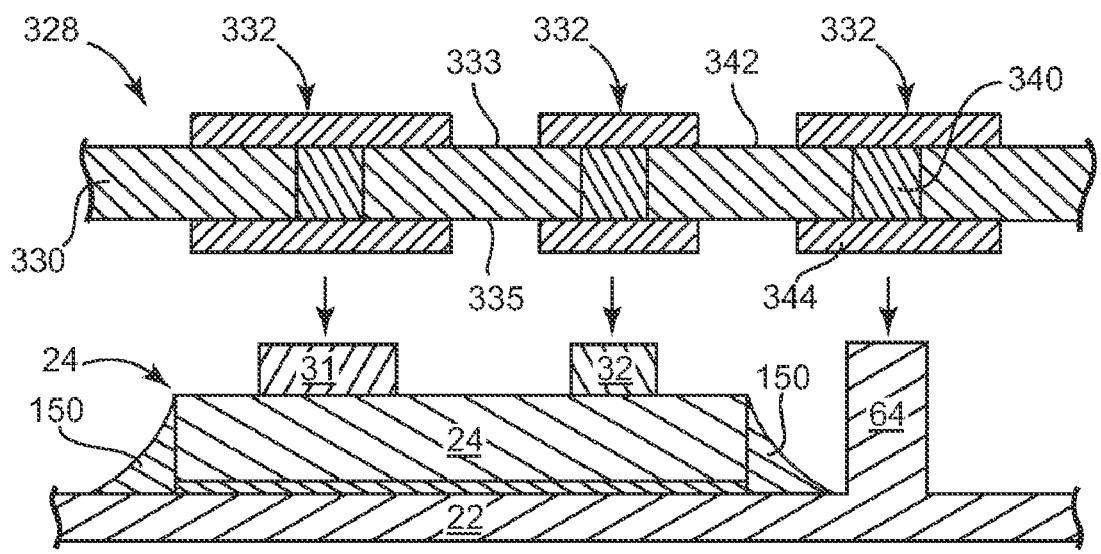
FIG. 10A and FIG. 10B are cross-sectional views of another foil assembly configured to be coupled to another carrier according to one embodiment.
Figure 10B:
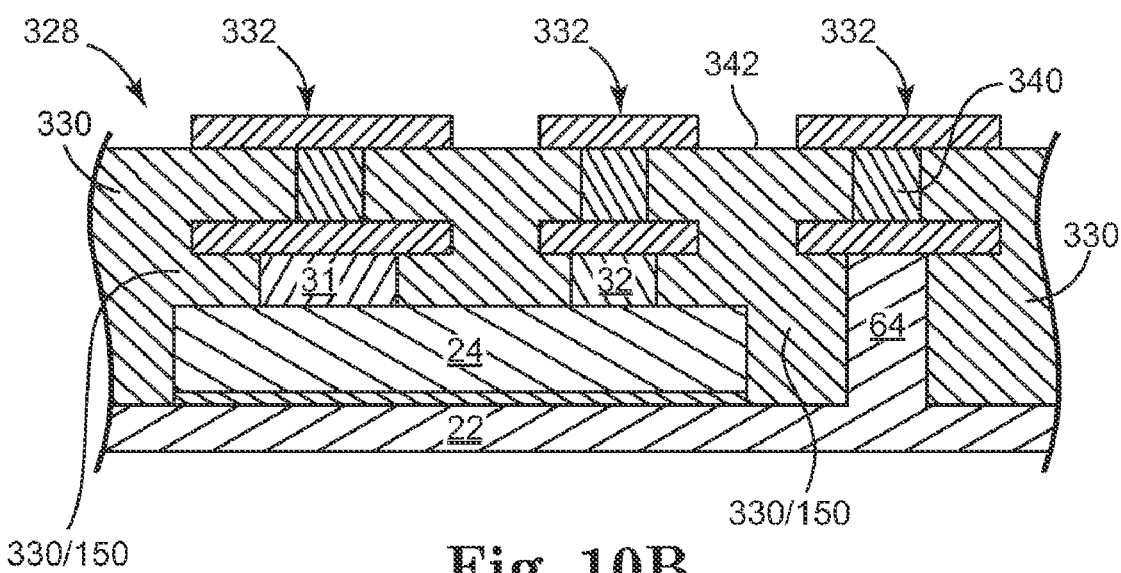

FIGS. 10A and 10B are cross-sectional views of another embodiment of a foil assembly 328 configured to be attached to chip 24 and leadframe 22. Chip 24 includes a fillet 150 of insulating material similar to chip 24 illustrated in FIG. 8A. In one embodiment, foil assembly 328 includes a polymer film 330 and a plurality of conducting elements 332 distributed throughout polymer film 330. In one embodiment, polymer film 330 includes a first surface 333 opposite a second surface 335 and conducting elements 332 include at least one conductor 342 in contact with surface 333 and at least one conductor 344 in contact with surface 335. In particular, one embodiment of conducting elements 332 provide a first conductor 340 extending between surfaces 333, 335 of film 330, a second conductor 342 connected to first conductor 340 and first surface 333, and a third conductor 344 connected to first conductor 340 and in contact with second surface 335.

Foil assembly 328 provides a flexible footprint design configured to provide a specific electrical contact configuration suited for coupling to contacts 31, 32, 64. When assembled, third conductor 344 connects with a respective one of contacts 31, 32, 64 to provide high current flow with a minimum of resistance. In one embodiment, a surface area of third conductor 344 is larger than a surface area of any one of the contacts 31, 32, 64, such that upon assembly, an improved electrical connection is provided to a top portion of chip 24. Conductor 342 provides a suitably large surface area for improved connection to printed circuit boards and the like. Embodiments described above provide for heating polymer film 330 above its melting point such that it flows around chip 24 and contacts 31, 32, 64 to fully encapsulate around these components. In one embodiment, polymer film 330 cooperates with fillet 150 to encapsulate side edges of chip 24.

Figure 11A:
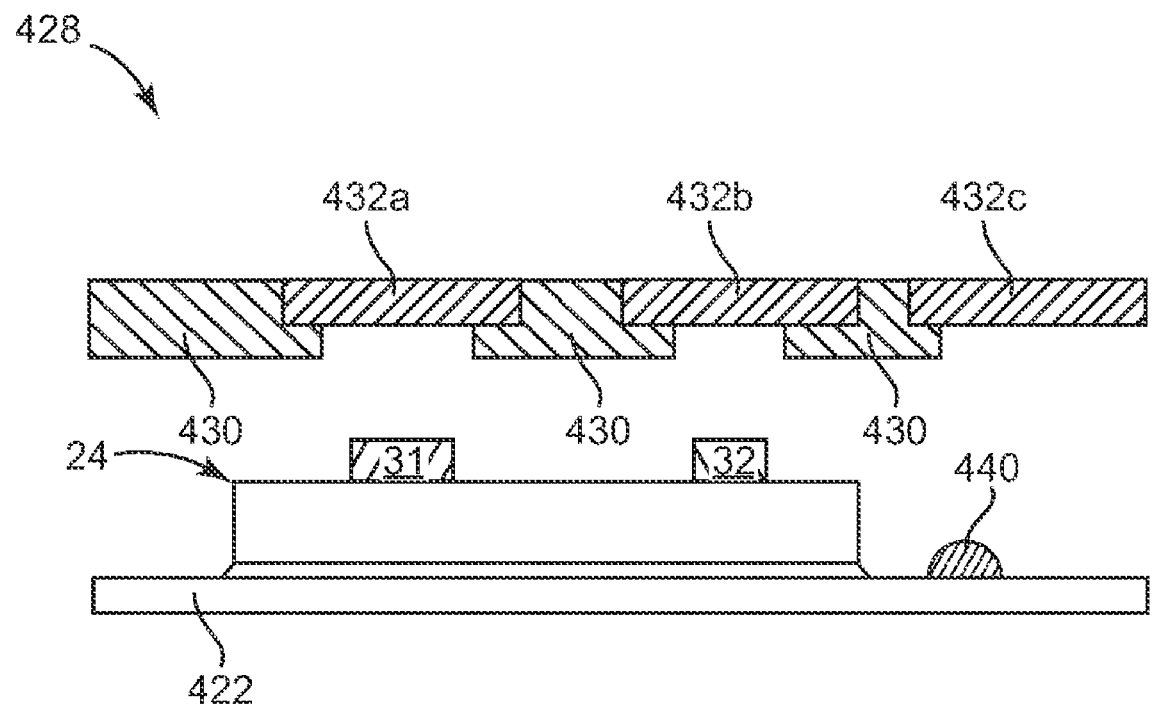
FIG. 11A and FIG. 11B are cross-sectional views of another foil assembly configured to be coupled to another carrier according to one embodiment.
Figure 11B:
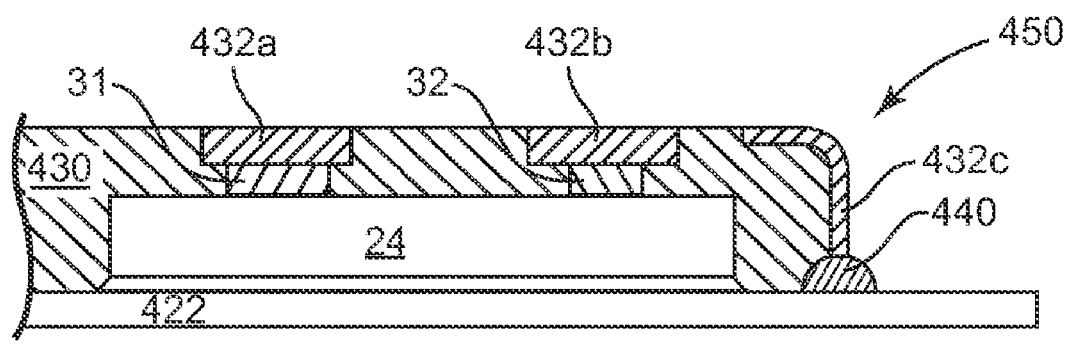

FIGS. 11A and 11B are cross-sectional views of another embodiment of a foil assembly 428 configured to couple to chip 24 and a carrier 422. In one embodiment, foil assembly 428 includes a polymer film 430 and a plurality of conducting elements 432a, 432b, 432c discretely distributed through polymer film 430. In one embodiment, carrier 422 is configured to support a plurality of chips 24 and provide an electrical pathway between foil assembly 428 and carrier 422 and includes a conduit 440 of a conductive material that is configured to cooperate with one of the conducting elements 432, for example, conducting element 432c to provide a drain contact extending between foil assembly 428 and carrier 422. Suitable conduits 440 include conductive adhesive pastes, beads of conductive metal, or low melting point metals that are configured to be brazed to one of the conducting elements 432.

In one embodiment, foil assembly 428 is connected to chip 24 and carrier 422 through a high temperature and pressure process in which conducting element 432a is connected to contact 31, conducting element 432b is connected to contact 32, and conducting element 432c is bent or forced out of the plane of film 430 and into contact with conduit 440 to provide a drain contact 450.

In one embodiment, contact 31 is coupled to a source pad of 24, contact 32 is coupled to a gate pad of chip 24, and drain 450 extends between a conductive portion of foil assembly 428 and carrier 422.

Embodiments provide a carrier that supports up to about two thousand semiconductor chips and an encapsulation unit that is configured to connect to the carrier and provide electrical connection to contacts provided on each of the chips. Embodiments described above provide foil assemblies that form an array across the encapsulation unit, where each foil assembly includes an array of conducting elements that are configured to align and couple with contacts fabricated on each chip. The encapsulation units and the foil assemblies that make up the encapsulation unit may be designed and configured to suit a variety of end use configurations. In this regard, the encapsulation unit and the foil assemblies that make up the encapsulation unit provide a flexible footprint design that enables further miniaturization of semiconductor devices in a relatively low cost fabrication process.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments of foil assemblies or encapsulation units providing conducting elements that connect to contacts of semiconductor chips, as discussed herein. Therefore, it is intended that this invention be limited only by the claims and the equivalents thereof.

What is claimed is:

1. An assembly of integrated power packages, the assembly comprising:
   a carrier;
   a plurality of chips attached to the carrier, each chip comprising a first contact and a second contact; and
   a monolithic encapsulation unit configured to be capped over the carrier and the plurality of chips, the encapsulation unit comprising a dielectric film surrounding an array of conducting elements comprising first conducting elements configured to connect to the first contacts of the chips, second conducting elements configured to connect to the second contacts of the chips, and third conducting elements configured to connect to the carrier,
   wherein the dielectric film comprises at least one layer and at least one polymeric bump extending from the layer, the layer and the polymeric bump configured to encapsulate around sides of the first contacts and the second contacts of each of the plurality of chips.

2. An assembly of integrated power packages, the assembly comprising:
   a carrier;
   a plurality of chips attached to the carrier, each chip comprising a first contact and a second contact; and
   a monolithic encapsulation unit configured to be capped over the carrier and the plurality of chips, the encapsulation unit comprising a dielectric film surrounding an array of conducting elements comprising first conducting elements configured to connect to the first contacts of the chips, second conducting elements configured to connect to the second contacts of the chips, and third conducting elements configured to connect to the carrier,
   wherein the carrier comprises a leadframe and a drain pillar extending from the leadframe, and the third conducting elements comprise a lateral metallized conductor sized to cover the drain pillar.

3. An assembly of integrated power packages, the assembly comprising:
   a carrier;
   a plurality of chips attached to the carrier, each chip comprising a first contact and a second contact; and
   a monolithic encapsulation unit configured to be capped over the carrier and the plurality of chips, the encapsulation unit comprising a dielectric film surrounding an array of conducting elements comprising first conducting elements configured to connect to the first contacts of the chips, second conducting elements configured to connect to the second contacts of the chips, and third conducting elements configured to connect to the carrier, wherein the array of conducting elements comprises a plurality of drain contacts, each drain contact configured to be forced out of the plane of the array and into contact with an upper surface of the carrier.

4. An integrated power semiconductor package comprising:
- a leadframe;
- a chip electrically connected to the leadframe, the chip comprising a first contact and a second contact; and
- a monolithic encapsulation unit capped over the leadframe and the chip and configured to establish concurrent electrical connection to the leadframe and to the first and second contacts of the chip,
- wherein the leadframe comprises a plurality of chip pads and a drain pad adjacent to each of the chip pads, one chip attached to each chip pad, and the monolithic encapsulation unit is capped over the leadframe and the chip to establish concurrent electrical connection to the drain pads and to the first and second contacts of the chips.

5. The integrated power semiconductor package of claim 4, wherein the encapsulation unit comprises an integrally formed monolithic dielectric film disposed around an array of conducting elements.

6. The integrated power semiconductor package of claim 5, wherein the array of conducting elements comprises a plurality of first conducting elements configured to connect to the first contacts of the chips, second conducting elements configured to connect to the second contacts of the chips, and a plurality of lateral metallized conductors each configured to contact one of the drain pads.

7. The integrated power semiconductor package of claim 5, wherein the array of conducting elements comprises a plurality of first conducting elements configured to connect to the first contacts of the chips, a plurality of second conducting elements configured to connect to the second contacts of the chips, and a plurality of third conducting elements each configured to be forced out of the plane of the array and into contact with one of the drain pads.

8. An assembly of integrated power packages, the assembly comprising:
- a carrier;
- a plurality of chips each having a first side attached to the carrier, each chip comprising a first contact and a second contact on a second side of each chip opposite the first side; and
- a monolithic encapsulation unit configured to be capped over the carrier and the plurality of chips, the encapsulation unit comprising a dielectric film surrounding an array of conducting elements comprising first conducting elements configured to connect to the first contacts of the chips, second conducting elements configured to connect to the second contacts of the chips, and third conducting elements configured to connect to the carrier,
- wherein the first conducting elements and the second conducting elements are arranged entirely on the second side of each chip, and
- wherein each conducting element of the array of conducting elements comprises a first conductor extending between a first surface and a second surface opposite the first surface of the dielectric film, a second conductor coupled to the first conductor and distributed across at least a portion of the first surface of the dielectric film, and a third conductor coupled to the first conductor and distributed across at least a portion of the second surface of the dielectric film.

* * * * *